United States Patent [19]

Thompson et al.

[11] 4,011,113
[45] Mar. 8, 1977

[54] METHOD OF MAKING INJECTION LASERS BY EPITAXIAL DEPOSITION AND SELECTIVE ETCHING

[75] Inventors: George H. B. Thompson; David F. Lovelace, both of Harlow, England

[73] Assignee: International Standard Electric Corporation, New York, N.Y.

[22] Filed: Jan. 2, 1976

[21] Appl. No.: 646,115

[30] Foreign Application Priority Data

Jan. 9, 1975 United Kingdom ............... 928/75

[52] U.S. Cl. ............................ 148/175; 29/580; 148/188

[51] Int. Cl.² ............ H01L 21/225; H01L 21/205; H01L 33/00

[58] Field of Search ............... 148/175, 187, 188; 357/16, 17, 18, 56; 331/94.5 H; 29/580; 156/11, 17

[56] References Cited

UNITED STATES PATENTS

| | | | |
|---|---|---|---|
| 3,445,303 | 5/1969 | Engbert | 357/56 X |
| 3,767,485 | 10/1973 | Sahagun | 148/188 |
| 3,780,358 | 12/1973 | Thompson | 148/175 X |
| 3,783,351 | 1/1974 | Tsukada et al. | 331/94.5 H |
| 3,824,493 | 7/1974 | Hakki | 331/94.5 H |
| 3,833,435 | 9/1974 | Logan et al. | 156/11 |
| 3,849,790 | 11/1974 | Gottsmann et al. | 357/18 |
| 3,859,178 | 1/1975 | Logan et al. | 204/15 |
| 3,893,044 | 7/1975 | Dumke et al. | 331/94.5 H |
| 3,920,491 | 11/1975 | Yonezu | 148/175 |
| 3,961,996 | 6/1976 | Namizaki et al. | 148/175 X |

OTHER PUBLICATIONS

Dumke, W. P., "Simple Planar Double-Heterojunction Laser Structure," I.B.M. Tech. Discl. Bull., vol. 16, No. 4, Sept. 1973, p. 1186.
Dumke et al., "Room Temperature Laser Array with Buried Diffusion Stripes."
IBID., vol. 16, No. 6, Nov. 1973, p. 1758.

*Primary Examiner*—L. Dewayne Rutledge
*Assistant Examiner*—W. G. Saba
*Attorney, Agent, or Firm*—John T. O'Halloran; Peter C. Van Der Sluys; Richard A. Menelly

[57] ABSTRACT

A double heterostructure injection laser has its active layer close to the surface. A rib protruding from that surface provides lateral optical confinement of laser radiation propagating in the active layer under the rib.

4 Claims, 2 Drawing Figures

METHOD OF MAKING INJECTION LASERS BY EPITAXIAL DEPOSITION AND SELECTIVE ETCHING

This invention relates to lasers, and in particular to the provision of lateral confinement of light within the laser cavity of double heterostructure injection lasers.

According to the present invention there is provided a double heterostructure injection laser wherein the active region lies so close to the semiconductor surface that lateral optical guiding of radiation within the optical cavity is realised at least in part by providing said surface with a protruding rib overlying the laser active region, which surface, in each of the regions flanking the rib, is bounded by a lower refractive index medium.

In British specification No. 1,273,284 there is described a way of obtaining current confinement in a heterostructure injection laser by arranging for the p-n junction to extend into the lower band gap material for only a short portion of its length. Under these conditions the current flow across the p-n junction is confined to the region where it is in the lower band gap material. This current confinement is accompanied by optical confinement provided by the heterojunctions. The optical confinement provided by heterojunctions can be relatively strong, but only in one of the described embodiments does the heterojunction fully encircle the active region providing strong optical confinement extending all round the active region. This invention discloses an alternative method of achieving lateral optical confinement by arranging for the active region to lie so close to the surface of the semiconductor material that the requisite optical guidance can be provided by a protruding rib of semiconductor material.

Accordingly the invention also provides a double heterostructure injection laser whose active region is contained in a layer bounded on both sides by lower refractive index and larger band gap layers, wherein the p-n junction of the laser extends in the larger band gap material except for a narrow strip extending in the direction of the optical axis of the laser cavity from one end face thereof to the other in which the p-n junction is bounded on at least one side by the lower band gap material of the active region thereby providing current confinement, and wherein optical confinement in the lateral direction is provided by the semiconductive material of the laser having a surface profile which includes a protruding rib overlying the strip which rib is flanked by regions where the semiconductive material is bounded by an interface with a lower refractive index medium which interface is so close to the layer containing the active region that the laser radiation preferentially propagates in the region under the rib.

The invention further provides a method of making a double heterostructure injection laser including the steps of forming a double heterostructure with a layer bounded on both sides by layers of the same conductivity type but larger band gap, the upper of said larger bandgap layers having a thickness not large compared with the wavelength of the laser radiation in said upper layer, of growing an epitaxial layer of opposite conductivity type on said upper layer using a conductivity type determining dopant of greater mobility and in greater concentration than used in the provision of the underlying layers of the double heterostructure, of selectively removing all of said epitaxial layer with the exception of a stripe extending in a direction normal to a cleavage plane, and of heating the structure so as to promote diffusion of the greater mobility dopant until the p-n junction beneath the stripe is translated into the smaller band gap layer of the double heterostructure.

There follows a description of the manufacture of a GaAlAs double heterostructure laser embodying the invention in a preferred form. The description refers to the accompanying drawings in which.

Figure 1:
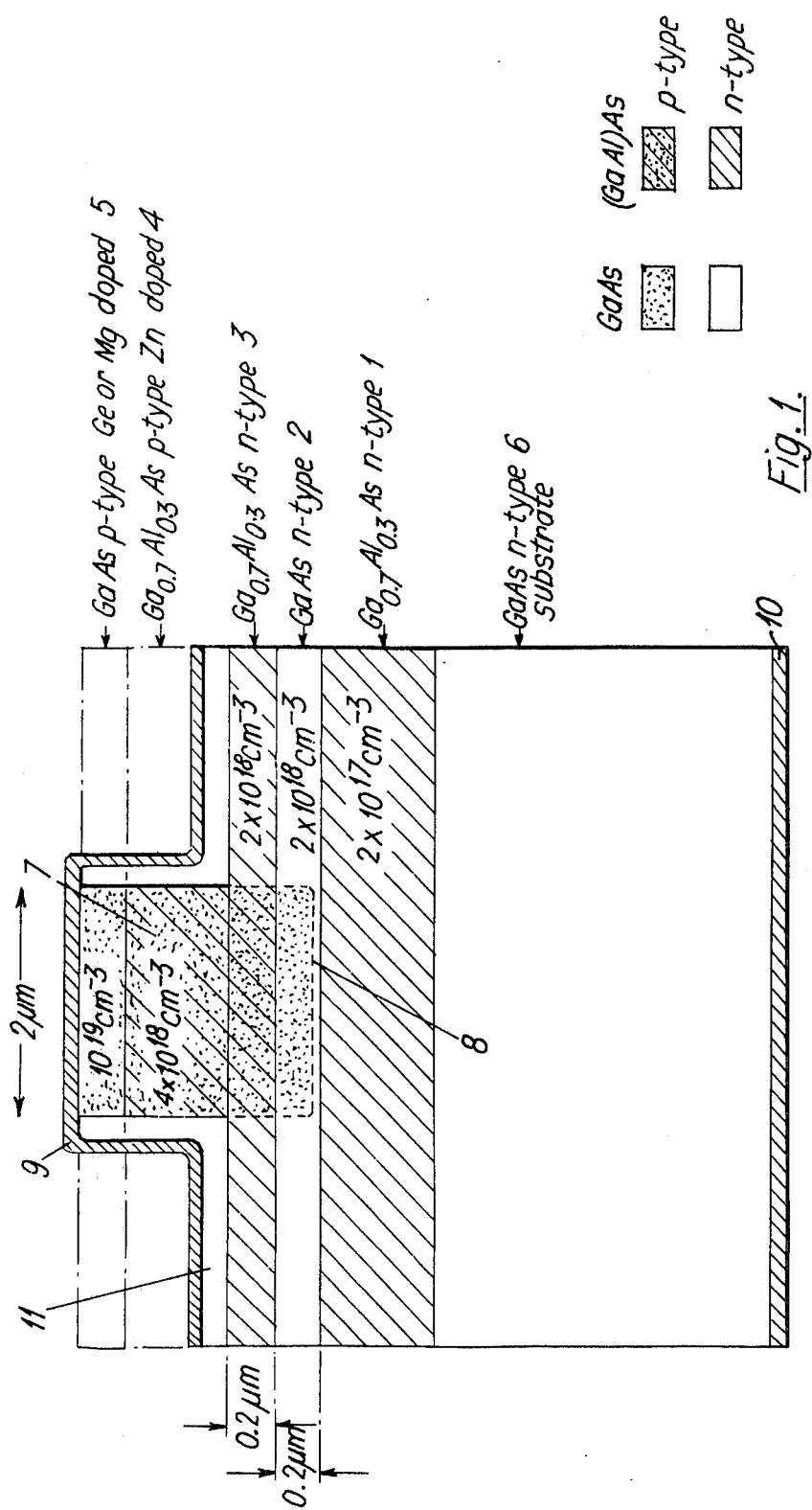
FIG. 1 depicts a schematic view of a cross section through the laser.

Referring to FIG. 1 a succession of three n-type layers 1, 2, 3, and then two p-type layers 4 and 5 are epitaxially grown upon an n-type GaAs substrate 6. The middle n-type layer 2 is of smaller band gap than layers 1 and 3. Layers 2 and 3 are thinner than layer 1. Layer 2 should have a carrier concentration (n-type) approximately equal to the electron concentration injected into that portion which forms the active layer of the laser, when the laser reaches threshold (about 1 to 2 × $10^{18}$ cm$^{-3}$). This minimizes transverse diffusion effects. Layer 4 is required to have a greater carrier concentration and larger band gap than layer 2, while layer 5 is a GaAs provided for the facilitating of making an electrical contact with the p-type material.

A central strip of layer 5 is masked so that the remainder of layers 4 and 5 can be selectively etched away to leave a projecting rib 7. The alignment of the mask is such that the rib extends in a direction normal to a cleavage plane. The etch is required to terminate at p-n junction forming the boundary between layers 3 and 4 and therefore it is convenient to make use of a self limiting electrochemical etch for this process. Alternatively the requisite material may be removed by anodic etching.

After the etch, the slice is heated to cause the p-type dopant of layer 4 to diffuse into the underlying n-type layers 2 and 3 so as to translate the p-n junction front 8 into layer 2. For this purpose layer 4 is required to have a greater carrier concentration than that of the underlying layers 2 and 3, and its dopant mobility must also be greater. Another process step is the provision of metallisation contact layers 9 and 10 on the p-type and n-type sides of the device. The dielectric layer 11 is required under contact 9 to prevent it from short-circuiting the p-n junction. This layer 11 may be provided by conventional passivation layer deposition techniques, but this will normally involve the removal of the initial mask covering the rib, and hence re-masking will be required to enable the passivation to be removed from the top of the rib to expose it to the metallisation 9. This remasking requires critical alignment in the case of fine width ribs, and hence it would be preferred to deposit the insulation by some method which makes use either of the mask used for creating the rib of the rib itself and hence avoids the necessity for remasking. One possible method is to create the layer 11 by anodisation. The layer so created must be capable of withstanding the temperatures involved in the subsequent diffusion of the p-type dopant through layer 3 into layer 2.

In order to obtain the maximum control of both the depth and the lateral spread of the diffusion, this diffusion should be arranged to be as shallow as possible. This means that the n-type layer 3 should be thin. The limit on its thinness is set by the allowable proximity of the optical guiding layer 2 to the interface between layer 3 and the dielectric layer 11. This must be decided in terms of the interaction of this interface with the guided propagation of light. Provided that the refractive index of the dielectric layer 11 is lower than that of layer 4 this interaction is favourable because the proximity of the interface tends to exclude the guided light from the regions under the interface and hence concentrate it under the rib. Only when the exclusion becomes so strong that higher order transverse modes can be set up under the rib can the interface be considered to be too close. The single mode condition depends upon the width of the rib in such a way that the narrower the rib is, the greater is the amount of material that can be removed from the regions flanking the rib before higher transverse modes are set up. This means that with a narrower rib the layer 4 can be thinner, with the result that the p-type dopant has a shorter distance to diffuse through, and hence the lateral diffusion is reduced and the junction width corresponds more nearly to the width of the rib. These factors cooperate in such a way that a rib width of about 1 $\mu$m is not impractical in a device having a layer 4 thickness in the region of 0.1 to 0.2 $\mu$m.

The mobile p-type dopant for layer 4 is conveniently zinc which has a significantly greater mobility than tin or tellurium which may be used as the dopant for the n-type layers. Layers 2 and 3 are lightly doped compared with layer 4 so that the diffusion of the zinc into layers 2 and 3 will readily result in a conversion of conductivity type. Typically layer 4 has a carrier concentration of 3 to 4 $\times$ 10$^{18}$ cm$^{-3}$ while layers 2 and 3 have 1 to 2 $\times$ 10$^{18}$ cm$^{-3}$. Layer 1 has a slightly higher carrier concentration of about 2 $\times$ 10$^{18}$ cm$^{-3}$ in order to minimise the risk of the p-n junction penetrating into it. Layer 5 has a high carrier concentration, typically of about 10$^{19}$ cm$^{-3}$, in order to minimise ohmic contact resistance; high impurity mobility is not desirable and hence germanium or magnesium may conveniently be used as the dopant.

The thickness requirements and compositions for layers 1 and 2 are the same as those of conventional double heterostructure lasers. Thus layer 1 is typically 1 $\mu$m thick Ga$_{0.7}$Al$_{0.3}$ As and layer 2, 0.2 $\mu$m thick GaAs. Typically layers 3 and 4 have the same percentage of AlAs as layer 1. Layer 4 is typically about 1 $\mu$m thick; and for a 2 $\mu$m rib width, layer 3 is preferably about 0.2 $\mu$m thick.

Layer 2 may alternatively be made of GaAlAs provided that its percentage of aluminum is much less than that of layers 1, 3 and 4.

Three layers may be used in place of a single layer 2 so as to produce a more complex structure in which the functions of electrical confinement and optical guidance are substantially separated. In this instance the middle layer of the three is made of smaller band gap material than the two flanking layers which in their turn are made of smaller band gap material than that of layers 1 and 2. The advantages of such a five layer heterostructure are explained in greater detail in British specification No. 1,263,835 to which attention is directed.

Figure 2:
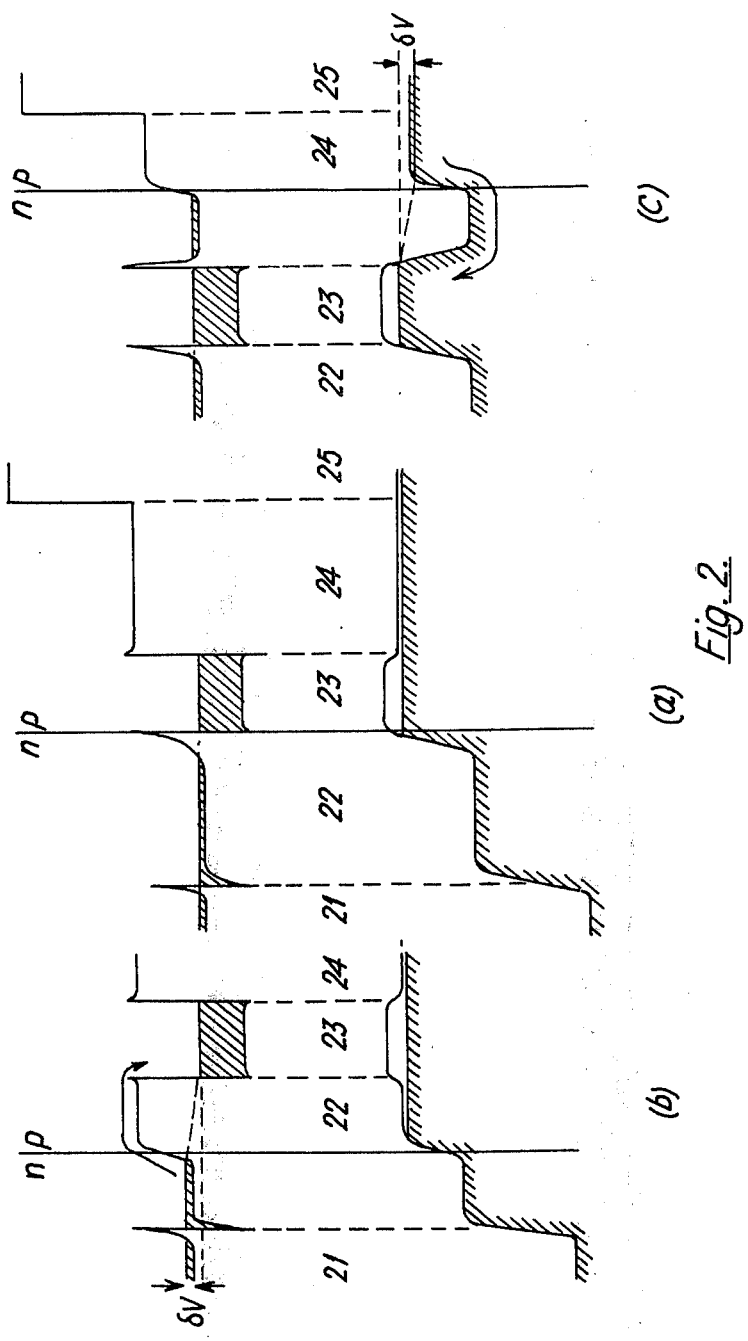
FIG. 2 depicts the band diagram for a modified version of the laser of FIG. 1.

Preferably the zinc diffusion should be terminated when the p-n junction lies in the active layer 23 which is the middle, lowest band gap, layer of the five layers. This is the condition depicted in the bandgap diagram of FIG. 2a. If however the diffusion does not go deep enough so that the p-n junction comes to rest in the intermediate band gap material layer 22 immediately above the active layer, the condition is as depicted in the band gap diagram of FIG. 2b. In this case an additional voltage $\delta$V is required to drive the injected electrons over the potential barrier and into the active layer. A rough calculation, assuming a carrier concentration in the active layer of about 2 $\times$ 10$^{18}$ cm$^{-3}$ at laser threshold, indicates that this additional voltage amounts to about 20 mV for an AlAs step of 16% at the heterojunction between layer 21 concentration at the heterojunctions bordering and the active layer 22. An analogous situation (FIG. 2c) occurs if the diffusion is so deep tha the p-n junction comes to rest in layer 24 immediately beneath the active layer. In this instance the injected holes require an additional voltage $\delta$V to tunnel under the potential barrier in the n-type part of layer 24. Making the same assumptions as before, it is calculated that for an AlAs step of 10% the voltage drop is less than 20 mV. For a voltage drop of 100 mV it is calculated that both the above AlAs steps could be increased by about 6%.

It is to be understood that the foregoing description of specific examples of this invention is made by way of example only and is not to be considered as a limitation on its scope.

What is claimed is:

1. A method of making a double heterostructure injection laser including the steps of forming a double heterostructure with a layer bounded on both sides by layers of the same conductivity type but larger band gap, the upper of said larger bandgap layers having a thickness not large compared with the wavelength of the laser radiation in said upper layer, of growing an epitaxial layer of opposite conductivity type on said upper layer using a conductivity type determining dopant of greater mobility and in greater concentration than used in the provision of the underlying layers of the double heterostructure, of selectively removing all of said epitaxial layer with the exception of a stripe extending in a direction normal to a cleavage plane, and of heating the structure so as to promote diffusion of the greater mobility dopant until the p-n junction beneath the stripe is translated into the smaller band gap layer of the double heterostructure.

2. A method as claimed in claim 1 wherein the laser is made of GaAlAs and wherein the dopant of greater mobility is zinc.

3. A method as claimed in claim 1 wherein said selective removal is effected using a self-limiting electrochemical etch.

4. A method as claimed in claim 1 wherein said selective removal is effected using anodic etching.

* * * * *